United States Patent
Vilhjalmsson et al.

(10) Patent No.: US 7,129,424 B2
(45) Date of Patent: Oct. 31, 2006

(54) MULTI-FILTER

(75) Inventors: Jon Reynir Vilhjalmsson, Kopavogur (IS); Jon Thor Olafsson, Gardabaer (IS)

(73) Assignee: Maref HF., Reykjavik (IS)

( * ) Notice: Subject to any disclaimer, the term of this patent is extended or adjusted under 35 U.S.C. 154(b) by 32 days.

(21) Appl. No.: 10/912,052

(22) Filed: Aug. 6, 2004

(65) Prior Publication Data

US 2005/0023046 A1   Feb. 3, 2005

Related U.S. Application Data

(63) Continuation of application No. 10/089,237, filed as application No. PCT/IS00/00010 on Dec. 4, 2002, now abandoned.

(30) Foreign Application Priority Data

Oct. 1, 1999   (IS) .......................................... 5207

(51) Int. Cl.
  *G01G 23/01*   (2006.01)
  *G01C 25/00*   (2006.01)
(52) U.S. Cl. .................. 177/25.13; 177/185; 702/101; 702/104; 708/300
(58) Field of Classification Search .. 177/25.11–25.19, 177/50, 185; 702/101–102
  See application file for complete search history.

(56) References Cited

U.S. PATENT DOCUMENTS

| | | | |
|---|---|---|---|
| 4,379,495 A * | 4/1983 | Cocks et al. .................... 177/1 |
| 4,529,050 A | 7/1985 | Mosher et al. ................... 177/1 |
| 4,553,619 A | 11/1985 | Fujinaga ...................... 177/185 |
| 4,706,767 A | 11/1987 | Chou ........................... 177/50 |
| 4,782,904 A | 11/1988 | Brock .......................... 177/185 |
| 4,790,398 A | 12/1988 | Nobutsugu ..................... 177/1 |
| 4,817,026 A | 3/1989 | Inoue et al. .................. 708/300 |
| 5,000,275 A | 3/1991 | Bullivant ................. 177/210 R |
| 5,130,938 A | 7/1992 | Inoue .......................... 702/194 |
| 5,174,400 A | 12/1992 | Hasegawa ..................... 177/200 |
| 5,178,228 A * | 1/1993 | Feinland et al. ............. 177/185 |
| 5,780,777 A * | 7/1998 | Selig ........................ 177/25.11 |
| 6,177,637 B1 | 1/2001 | Evans ........................ 177/25.13 |
| 6,271,484 B1 | 8/2001 | Tokutsu ..................... 177/25.13 |
| 6,774,319 B1 * | 8/2004 | Aoki et al. .................. 177/144 |
| 2004/0153780 A1* | 8/2004 | Strohrmann et al. | |

FOREIGN PATENT DOCUMENTS

EP           0132054 A2 *   1/1985

* cited by examiner

*Primary Examiner*—Randy W. Gibson
(74) *Attorney, Agent, or Firm*—Pillsbury Winthrop Shaw Pittman LLP

(57) ABSTRACT

The present invention relates to a method for weighing items and in particular to a method of filtering signals representing the weight of an item. The invention is applicable in all measuring instruments which indicate an average value calculated from a signal which also has unwanted components of one or more unknown frequencies. This is, for example, the case in volumeters, ampere meters and weighing-scales. Normally, the indicated result is the average value of the signal measured for a much longer time than the expected period of the slowest frequency component. This method is well known and reliable, but has the drawback of being very slow in situations where measuring speed is of importance.

19 Claims, 2 Drawing Sheets

MULTI-FILTER

RELATED APPLICATIONS

This Application is a continuation of application Ser. No. 10/089,237, with an effective filing date of Dec. 4, 2002, the entire contents of which is hereby incorporated by reference. Application Ser. No. 10/089,237 is the National Phase of International Application PCT/IS00/00010 filed 2 Oct. 2000 which designed the U.S. and that International Application was published under PCT Article 21(2) in English.

FIELD OF THE INVENTION

The present invention relates to a method for weighing items and in particular to a method of filtering signals representing the weight of an item.

The invention is applicable in all measuring instruments which indicate an average value calculated from a signal which also has unwanted frequency components of one or more unknown frequencies.

This is, for example, the case in voltmeters, ampere meters and weighing-scales. Normally, the indicated result is the average value of the signal measured for a much longer time than the expected period of the slowest frequency component. This method is well known and reliable, but has the drawback of being very slow in situations where measuring speed is of importance.

The invention is of particular importance in high speed weighing scales. In that case, the average value is the result (the weight) but because of vibrations in the mechanics of the scale and its base, a lot of unwanted frequency components are added to the measured value.

DESCRIPTION OF THE PRIOR ART

Electronic scales comprising a load cell providing readout in terms of voltage representing the weight of the item today perform weighing of items. This readout is typically passed through an analogue to digital (A/D) converter that converts the electrical signal to a digital signal normally represented by a bit representation of a number. This bit representation is then manipulated further in order to provide an readout of the weight of the item on display.

When an item is to be weighed by such an electronic scale—or in general by an ordinary scale—the item is arranged on a scale platform. As the mechanical parts of the scale are not weightless the scale platform and the parts connected to the platform may be able to vibrate which in turn influences the readout—the measurement—of the scale. The vibration may in general be induced by at least two measures: the way the item is arranged on the scale platform arid the vibrations of the surroundings.

The first measure may for instance be instanced by dropping an item on to the scale platform—a situation, which for instance occur in a process line in which items are being conveyed from a processing station past a weighing station to a grading and/or packing station.

The second measure may for instance be instanced when the scale is applied in an environment in which heavy machinery inducing vibrations is present.

In both cases, or of course in combinations of these, the signal of from the load cell and in turn the readout of the weight will follow a curve which ideally can be described as the motion of a damped oscillation, where the average value of curve is the final steady state value, i.e. the weight which is to be determined.

In weighing scales there are mostly 3 types of unwanted frequency components. These occur due to:

1 Steady vibrations in the base of the scale from nearby machinery.

2 Vibrations which occur when an object is placed on the platform. These vibrations cease when the mechanism becomes stable.

3 Short-duration mechanical transients which hit the base of the scale.

Every scale designer wants to make a fast scale, which displays the correct result as soon as an object is placed on the platform. A faster scale saves both time and money. At the same time, he wants the scale to be insensitive to vibrations and shocks that strike the platform or the base of the scale. Unfortunately, it is difficult to achieve both features at the same time using only one filter.

If a fast low pass filter is used—with a high cut-off frequency, the scale will be fast, but vibrations and shocks will affect it, leading to unsteady results. Conversely, if a slow low pass filter is used—low cut-off frequency, the scale will be less sensitive to transients and unwanted frequency components, but the scale will be slow to display results.

Weighing scales must show reliable results, along with an indication on the stability of the scale. As a result, designers usually use a slow filter to minimise the risk of the scale being unsteady all the time, and therefore being of no use.

The invention is very useful, as it allows the use of fast filters without the risk of the scale being useless if the base is vibrating.

In known systems the signal from the load cell is filtered either through digital or analogue means with a "low pass filter". A low pass filter is attenuating all parts of the signal having a higher frequency than the selected cut-off frequency. By using low pass filtering a steady readout is obtained faster than if no filter is applied as the mechanical system then has to be in rest before a steady readout is available.

The optimal cut-off frequency is typically a function of the weight of the moving parts of the scale, the weight of the item to weight, the mechanical damping characteristics of the scale and the vibrations induced by the surroundings. This means that the scale typically is equipped with more than one cut-off filter in order to be able to work as fast as possible in different environments and with items of varying sizes.

A major problem with these known systems is however that if the vibrations due to placing items on the scale platform vary considerably for instance from one item to another, and/or the vibrations induced by the surroundings also vary, then a single filter with a fixed cut-off frequency will not always yield the fastest possible weighing result and readout of the scale.

The speed of weighing is important, as it is frequently the limiting time factor in a grading process.

The most common method of selecting an optimal filter on weighing instruments is to do it manually. A manual change or selection of filter is in nature quite slow as it involves an operator changing the set-up of the scale. Furthermore it may not be possible to select the most optimal filter manually. As an example the measures induced by the way the items are being arranged on the scale or induced by external conditions, such as heavy traffic occurring in the weighing area could change instantly, whereby manual setting would not practically be possible.

BRIEF SUMMARY OF THE INVENTION

It is an aim of the present invention to provide a method for automatically selecting an optimal low pass filter having the best cut-off frequency such that weighing of items may be performed as fast as possible with a particular scale and so that the scale will always respond to the actual conditions of the weighing.

Accordingly the present invention relates to a method for providing a measure of an item, the method comprising the steps of:

reading a first signal being responsive to the measure of the item, frequently measuring a plurality of values of the signal so as to provide a stream of data, repetitively providing output signals from at least two different processing means until an output signal of a first one of the at least two different processing means fulfils a stability requirement, the output signals being based on processing of the stream of data, and assigning an output signal from the first one of the at least two different processing means that fulfilled the stability requirement to the measure.

The measure of the item could as an example be the weight of the item, the size of the item, the colour of the item or any other measure of the item. As an example the first signal being responsive to the measure of the item could be an electrical current from an electrical scale, the voltage, the resistance or the current being responsive to the weight of the item. As another example the first signal could be an electrical current provided e.g. by a CCD of a digital camera. In that case the conversion of the signal into a stream of data would typically happen internally in a processor of a digital camera or camcorder.

In a broad aspect, the present method according to the present invention is applicable to any kind of processing of a stream of digital signals being the result of for instance an analogue-to-digital conversion, the analogue signal being the result of some recognition—or measuring—of one or more physical quantity, such as a weight of an item.

In the present content, a digital signal denotes a signal being represented by a stream or a series of digital values, ordered sequentially by time.

In a preferred embodiment of the present invention the stream of digital values (signals) is a substantially constant inflow of digital values to the processing means. The processing means are preferably numerical algorithms executed in a digital processor such as a microcomputer, but hardware processing means may also be used in connection with the present invention.

The processing means, which in general are different, are different in the sense that the processing performed by them are said to vary in degree. By this varying processing degree is meant that for instance the cut-off frequencies of the processing means, in case these are characterised as filters are different. In other cases, the difference may be the way they process the digital signals such as one processing giving a average value and another processing means giving a filtered value (please note that in some case process providing an average value is referred to as a filtering process).

In the broad aspect of the present invention each of the processing means provides an intermediate output signal. These signals are in general different, as they are the results of applying the processing means, which are different, to the stream of digital values. After these intermediate signals are made available by the processing means the method according to the present invention detects the signal being the most appropriate for the time being, i.e. the signal from the fastest filter which fulfils a stability requirement. The most appropriate signal is assigned to be the output signal.

According to a preferred embodiment of the invention the processing means calculates an average value of N last provided data of the stream of data. N could denote the 10, 100 or even 1000 latest provided data. In the case a small number of data is used for the calculation of the average, the processing means would be very fast but on the other hand the output signals from the processing means could be rather fluctuating. If a larger number of data is used, the processing means would be slower but the output signal would typically be more stabile. The number of data N could preferably be selected differently for each of the processing means applied. In that sense the processing means would have different reaction speed and their output signal would have different characteristics.

The stability requirement to be fulfilled could simply be comparing an output signal of one of the at least two processing means with a reference value. The reference value could be the last output signal of the same processing means or an output signal of one of the other processing means. Accordingly the stability requirement could be a requirement to a maximum difference between two successive output signals of one of the processing means.

Preferably one of the processing means is working in a large domain of data, such as on a set of data including a larger number N of data. The other processing means are then working on smaller sub-set of the N data. If the processing means are processing averages of the data, the one of the processing means that works with the large domain would be relatively slow compared with the other processing means. On the other hand the fluctuation in the output signal of the processing means working in the large domain of data would be relatively low.

As an example the processing means could be provided in the form of digital filters for filtering the stream of data. The digital filter could be low-pass filters running averaging algorithms numerically evaluating the mean values of the stream of data.

Preferably the running averaging algorithms are applied successively; the next algorithm applied is applied based at least partly on the result of the previously applied algorithm.

In case no output signals fulfils the stability requirement, an output signal from the last one, or the slowest one of the processing means could be assigned to the measure. The slowest one of the processing means would in the case of processing averages be the one processing the largest number N of data. If no output signals fulfils the stability requirement, an output signal from one of the "medium speed" processing means may also be selected, e.g. one running averaging with a medium number N of data or actually any one of the processing means may be selected.

In the following the invention and particular preferred embodiments thereof will be described in greater details with reference to the accompanying figures in which:

DETAILED DESCRIPTION OF THE DRAWINGS

Figure 1:
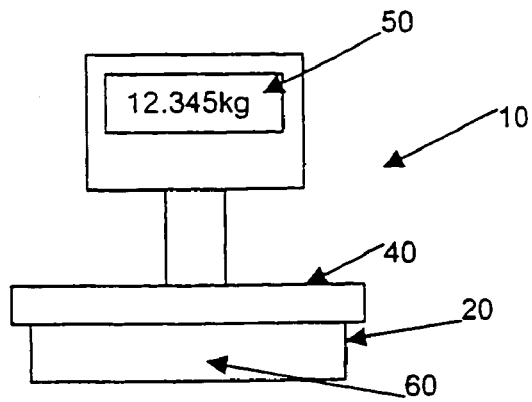
FIG. 1 is a schematic drawing of an electronic weighing scale.

In FIG. 1 a typical electronic scale 10 is shown. The scale 10 comprises a base part 20 wherein a load cell 60 is situated, a scale platform 40 on which the item to be weighed is placed and display 50. The scale 10 also comprises a logical unit such as a computer or a micro-controller for transforming the signal coming from the load cell 60 to a readout on the display 50.

Figure 2:
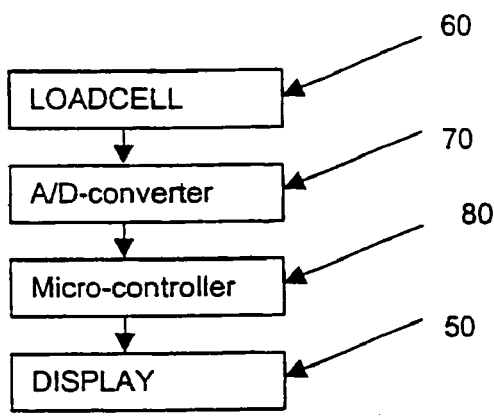
FIG. 2 shows a diagrammatic view of the main elements of the method of weighing according to the present invention.

In FIG. 2 the electronics comprised in the scale 10 are schematically depicted. The actual choice of electronic components is not crucial for the invention as ordinary known electronically components may be used. Referring to FIG. 2 the load cell 60 which may comprise a strain gauge acting as a resistor in a Wheatstone bridge circuitry is actuated by for instance a rod connected to the scale platform 40.

The load cell 60 will thereby provide an electrical signal with a magnitude representing the force of the scale platform 40 applied to the load cell 60. This force will in general be different from the weight of the moving part of the scale plus the force due to the weight of the item times the gravity constant until these parts are in rest. This as the movement of the parts involves acceleration of the parts.

The signal coming from the load cell 60 is then directed to an A/D-converter 70 from which a bit pattern representing the actual amplitude of the signal from the load cell is provided at a predetermined sampling rate. The sampling rate and the resolution of the A/D-converter may be determined by the physics of the scale.

Figure 3:
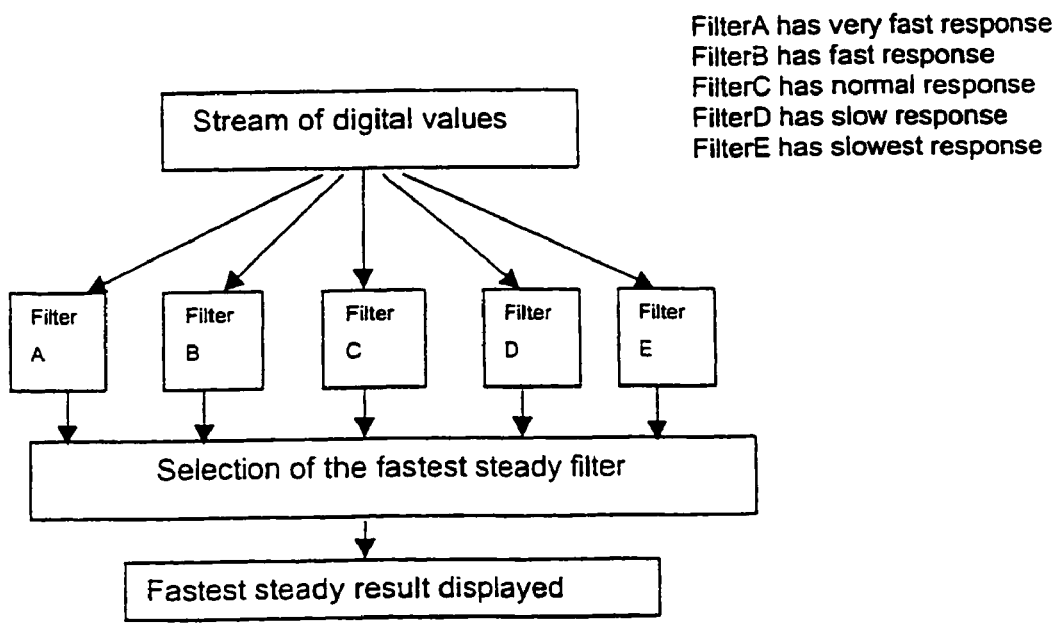
FIG. 3 shows a schematic drawing of a preferred embodiment of the filtering method according to the present invention.

The bit pattern is then directed to a micro-controller 80 being able to perform a filtering of the signal. Referring to FIG. 3, the filtering is performed by use of, for instance, five low pass filters having different cut-off frequencies:

The low pass filters can for example be implemented as moving average filters.

A moving average filter calculates the average value from a set of N last digital values in a stream of data. The size of the set N determines the response or behaviour of the filter as well as the sampling rate of the data. If the filter uses many digital values in the calculation then a single new input value will have little effect on the average and the filter will slowly change the result as the input data changes. On the other hand if the filter is calculating average from a few digital values, the average changes quickly if the newest value is changed The following is an example of filters that may be used in connection with weighing according to the present invention.

Filter A (very fast response—very sensitive to exterior vibrations). The filter has only 1 digital value. The result is:

$$\bar{x}_1 = \frac{newest\_digital\_value}{1}$$

Filter B (fast weighing). The filter calculates the average of the last 2 digital values in the input stream. The result is:

$$\bar{x}_2 = \frac{newest\_digital\_value + the\_value\_before}{2}$$

Filter C (normal weighing). The filter calculates the average of the last 4 digital values in the digital stream.

$$\bar{x}_4 = \frac{value\_1 + value\_2 + value\_3 + value\_4}{4}$$

Filter D (slow weighing) The filter calculates the average of the last 8 digital values in the input stream, $$\bar{x}_8 = \frac{\sum_{i=1}^{8} value\_i}{8}$$

Filter E (slowest weighing not sensitive for exterior vibrations) The filter calculates the average value of the last 16 digital values in the input stream, $$\bar{x}_{16} = \frac{\sum_{i=1}^{16} value\_i}{16}$$

The filtering is performed by the following scheme. Each time a value is available at the output of the A/D-converter, this value is directed to the filtering means. The filtering means holds a list of values corresponding to a pre-selected number of earlier measured values. Each filter is activated and determines filtered intermediate filtered values, one for each filter, based on the new value and the old values except the oldest.

For each of the filters applied, the intermediate filtered values are checked for stability, i.e. the most recent determined intermediate value corresponding to a specific filter is compared with the value determined last time the same filter was activated. If the difference between these two successive intermediate values is within a certain limit then the signal filtered with the specific filter is said to be stable.

In many practical applications more than one intermediate value is found to be stable and in that case the intermediate value corresponding to the fastest filter is selected as the output value from the filtering routine. The reasoning behind choosing the value corresponding to the fastest filter is that this choice will provide the earliest stable readout.

According to the general aspect of the present invention a selection of the most appropriate filter is done. Before going into a detailed description of the selection routine and a preferred embodiment of this and the filters applied, the general structure of the filtering routine is explained with reference to FIG. 3.

Figure 4:
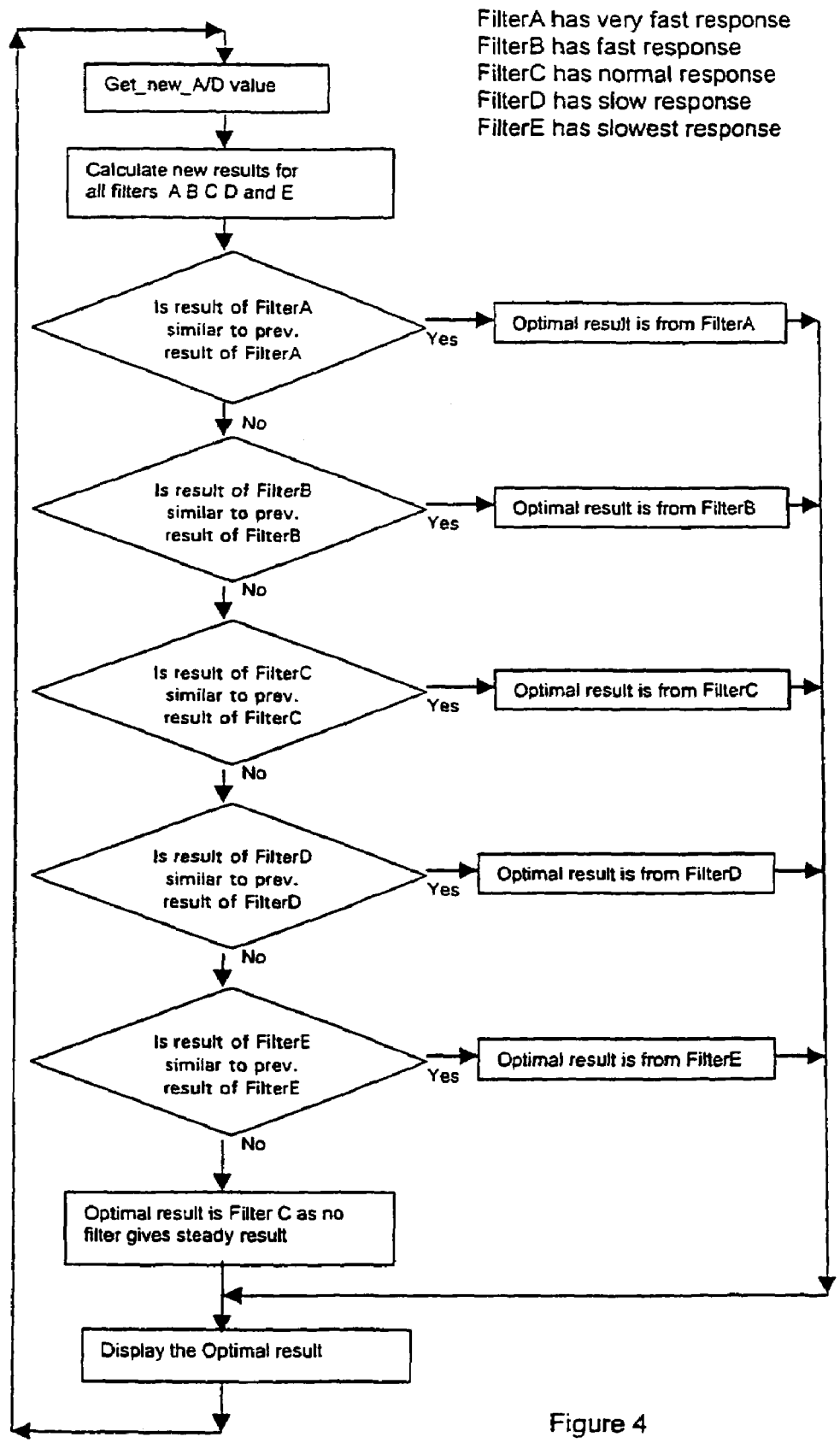
FIG. 4 shows a flow chart of a preferred embodiment of the filtering method according to the present invention.

The digital weight signal, Input value of FIG. 3, provided by the A/D-converter is filtered with a number of different filters, Filter A, Filter B, Filter C, Filter D and Filter E of FIG. 3. The output from each filter is checked for stability and the least filtered (fastest) steady value is selected. This will give the fastest possible response. FIG. 4 is a flowchart showing the Multi-Filter System principle.

In the following text filter algorithm to be used in connection with the present invention will be introduced. The features of the method according to the present invention may in general be described by the following item list:

There are several low-pass filters running at the same time.

The invention deals with the selection of the filters in real time

The lowpass filters have different corner frequencies, but their exact implementation is not important.

The software selects in real time the fastest steady filter.

If no filter gives a steady result one of the medium ones is normally selected.

The method according to the present invention works in the following way, when considering different situations:

Steady vibrations attack the base of the scale:

Only some of the slowest filters will produce steady results, and for each item being weighed, the filter producing a steady result fastest, will be used.

The scale will work accurately, but will be slow.

Vibrations occur when an object is placed on the platform and stop when the mechanical structure becomes stable:

A signal will be formed when the object it put on the platform but it will have unwanted frequency components because of the vibration.

The results from all filters are monitored and the result from the first filter to show a steady result will be used.

Which filter will be the first filter to give a steady result depends on the system character and the vibrations,.

In a well-designed system, the fastest filter would be the first to become stable if no vibration exists in the base.

Transient shocks on the base:

In this case the fastest filters will give unsteady result, and the software will look for a slower filter still not affected by the shock.

The displayed result remains steady until the slowest filter gives an unsteady result. This gives the scale the stability of the slowest filter.

Steady Calculation:

One way of detecting a steady result from a filter is to calculate the difference between the last two results and compare it to a predetermined small value. If the difference is greater than the value, the filter result is not stable. The time between any two results is normally constant, for example 50 or 100 milliseconds.

It is also possible to use a change in the final displayed result (weight) as an indication of a steady result. This can be an advantage in weighing scales where the displayed weight must be rounded in certain way to comply with "General Weights and Measures" regulations. The method can give better results but requires more processing power.

FIG. 4 shows a flowchart describing the invention.

Following method according to the present invention is described with reference to a program which, when launched in a computer will perform the selection of the optimal filter. The program is described in Pascal like language and comprises the following statements:

The first 17 lines are comments.

```
*       FilterA    A variable that holds the result of a FilterA    (very fast response)
*       FilterB    A variable that holds the result of a FilterB    (fast response)
*       FilterC    A varibale that holds the result of a FilterC    (normal response)
*       FilterD    A varibale that holds the result of a FilterD    (slow response)
*       FilterE    A variable that holds the result of a FilterE    (slowest response)
*
*       Filter_A_steady    A flag that is true if FilterA gives a steady result
*       Filter_B_steady    A flag that is true if FilterB gives a steady result
*       Filter_C_steady    A flag that is true if FilterC gives a steady result
*       Filter_D_steady    A flag that is true if FilterD gives a steady result
*       Filter_E_steady    A flag that is true if FilterE gives a steady result
*       Optimal_Result     A variable that holds the selected, optimal result
*
*
*
*   The following is the program describing the invention
*
Repeat
        Get_new_ADvalue;            * Get a new value from the A/D converter
        Calculate_new_results;      * All filters are recalculated
        Optimal_Result := FilterC;  * Use normal response filter if no filter is stable
        If Filter_E_steady THEN Optimal_Result:= FilterE ;
        If Filter_D_steady THEN Optimal_Result:= FilterD ;
        If Filter_C_steady THEN Optimal_Result:= FilterC ;
        If Filter_B_steady THEN Optimal_Result:= FilterB ;
        If Filter_A_steady THEN Optimal_Result:= FilterA ;
        Display(Optimal_Result ;    * Display the result from the fastest steady filter
until false
```

The invention claimed is:

1. A method for providing a measure of an item, the method comprising:
   reading a first signal being responsive to the measure of the item with a measuring device, the first signal having been converted into a stream of data;
   repetitively providing output signals from at least two different processing means until an output signal of a first one of the at least two different processing means fulfils a stability requirement, the output signals being based on processing of the stream of data of the first signal obtained with said measuring device, and
   assigning an output signal from the first one of the at least two different processing means that fulfilled the stability requirement to the measure.

2. A method according to claim 1 wherein the first signal is measured as a signal and wherein a plurality of values of the signal frequently is being measured so as to provide a stream of data.

3. A method according to claim 1, wherein the processing comprises calculating an average value of N last provided data of the stream of data.

4. A method according to claim 1, wherein each of the at least two different processing means processes an average value of a number of last provided data of the stream of data N and wherein N is a different number for each of the processing means.

5. A method according to claim 1, wherein the stability requirement to be fulfilled comprises comparing an output signal of one of the at least two processing means with a reference value.

6. A method according to claim 1, wherein the stability requirement to be fulfilled comprises a requirement to a maximum difference between two successive output signals of one of the at least two processing means.

7. A method according to claim 1, wherein the first signal is an electrical current provided by an instrument.

8. A method according to claim 7, wherein the electrical current is converted into a stream of digital data by means of an A/D converter.

9. A method according to claim 1, wherein the first signal is representing responses to weighing of an item on a weighing scale.

10. A method according to claim 1, wherein the processing means comprises digital filters for filtering the stream of data.

11. A method according to claim 10, wherein the digital filters comprise low-pass filters.

12. A method according to claim 11, wherein the low-pass filters are running averaging algorithms numerically evaluating the mean values of the stream of data.

13. A method according to claim 12, wherein the sets of measured data to be used in the running averaging algorithms are series of numbers 2, 4, 8, 16 numbers of values of the stream of data.

14. A method according to claim 13, wherein the running averaging algorithms are applied successively; the next algorithm applied is applied based at least partly on the result of the previously applied algorithm.

15. A method according to claim 1, wherein an output signal from the last one of the at least two different processing means is being assigned to the measure in case no output signal fulfils the stability requirement.

16. A method according to claim 1, wherein an output signal from a processing means with a medium processing speed is being assigned to the measure in case no output signal fulfils the stability requirement.

17. A method for providing a measure of an item, the method comprising:
   converting a signal into a digital stream of data, said signal resulting from the measure of the item with a measuring device;
   subsequent to said converting, processing said digital stream of data with at least two separate processing devices, each of said at least two separate processing devices outputting an output signal; and
   selecting the output signal output by one of said at least two separate processing devices that fulfills a stability requirement of the measure.

18. A method according to claim 17, wherein said processing includes repetitively processing said digital stream of data with at least two separate processing devices until the output signal output by one of said at least two separate processing devices fulfills a stability requirement.

19. A method according to claim 17, wherein said processing includes filtering said digital stream of data with at least two separate filters.

* * * * *